United States Patent [19]

Doany et al.

[11] Patent Number: 5,387,484
[45] Date of Patent: Feb. 7, 1995

[54] TWO-SIDED MASK FOR PATTERNING OF MATERIALS WITH ELECTROMAGNETIC RADIATION

[75] Inventors: Fuad E. Doany, Katonah; Douglas S. Goodman, Yorktown Heights, both of N.Y.

[73] Assignee: International Business Machines Corporation, Armonk, N.Y.

[21] Appl. No.: 909,886

[22] Filed: Jul. 7, 1992

[51] Int. Cl.6 .............................................. G03F 9/00
[52] U.S. Cl. ...................................... 430/5; 430/322; 430/323; 430/324; 430/312
[58] Field of Search ................... 430/5, 322, 323, 324, 430/945, 312; 156/635, 643

[56] References Cited

U.S. PATENT DOCUMENTS 4,842,677 6/1989 Wojnarowski et al. ............ 156/652
4,877,480 10/1989 Das ..................................... 430/323

FOREIGN PATENT DOCUMENTS 2-25289 1/1990 Japan .

*Primary Examiner*—Steve Rosasco
*Attorney, Agent, or Firm*—John J. Goodwin; Robert M. Trepp

[57] ABSTRACT

A mask and a fabrication method therefor that incorporates a patterned radiation blocking layer such as a second patterned high-reflectivity dielectric coating on the back surface of the mask which also includes a first patterned reflective coating on the front. This second high-reflective dielectric coating referred to as a premask, eliminates most of the laser energy directed onto the mask that leads only to substrate heating without effecting the laser energy transmitted through the open area of the mask. The open areas of the premask are sufficiently larger than those in the mask so not to interfere with the illumination geometry (i.e. forms a greater angle than the illumination numerical aperture).

16 Claims, 1 Drawing Sheet

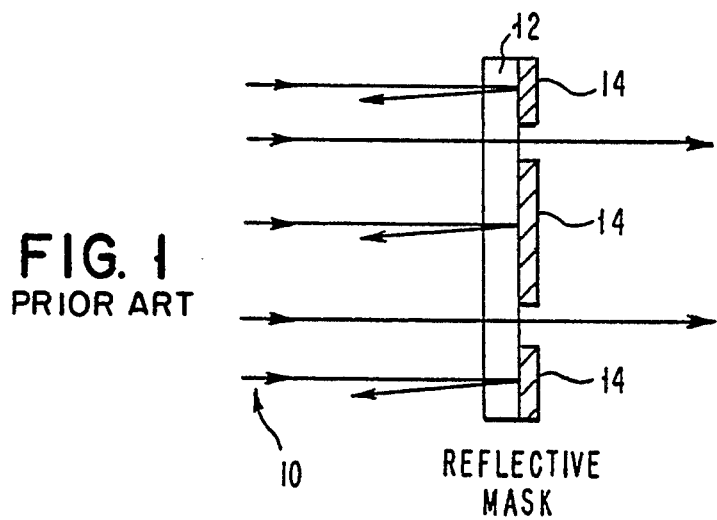
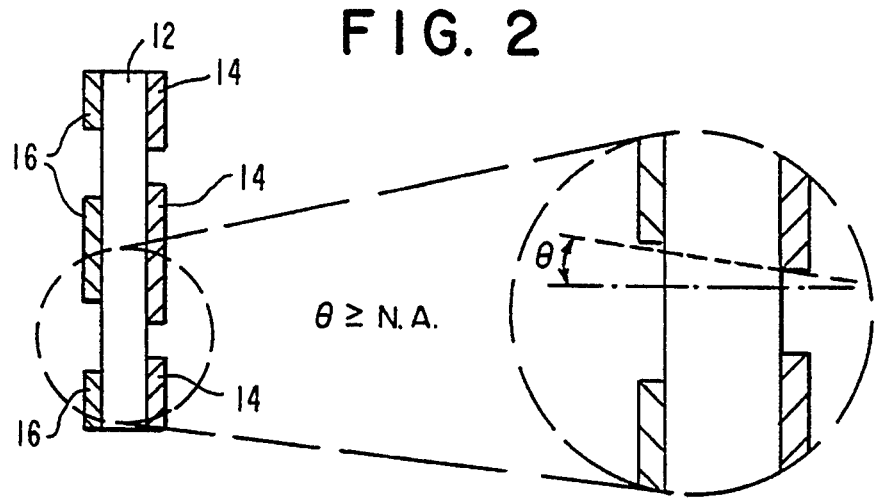
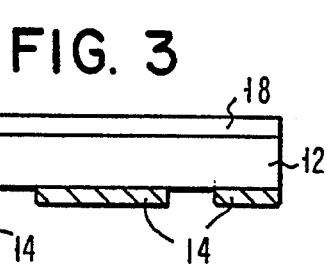
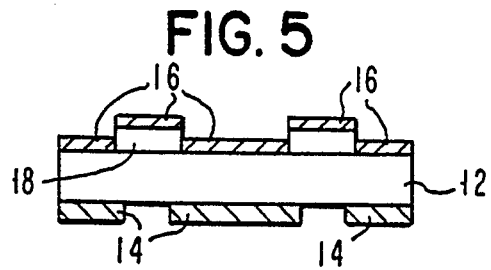
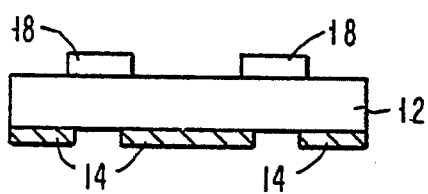
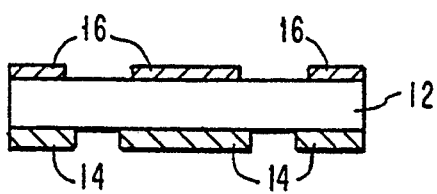

TWO-SIDED MASK FOR PATTERNING OF MATERIALS WITH ELECTROMAGNETIC RADIATION

BACKGROUND OF THE INVENTION

1. Field of the Invention

The present invention relates to non-contact masks used with electromagnetic energy sources for projection of patterns for etching and ablation and more particularly to a reflective mask with an extended lifetime.

2. Description of the Background Art

U.S. Pat. No. 4,923,772 issued May 8, 1990 to Kirch et al. entitled, "HIGH ENERGY LASER MASK AND METHOD OF MAKING SAME" describes a mask and methods for making masks for use with a laser projection etching system. The unique mask is able to withstand the fluences of the high energy and high power lasers used without degrading. Specifically, the new projection etching masks are fabricated of patterned multiple dielectric layers having alternating high and low indices of refraction on a UV grade synthetic fused silica substrate in order to achieve maximum reflectivity of the laser energy in the opaque areas and maximum transmissivity of the laser energy in the transparent areas of the mask.

U.S. Pat. No. 4,317,876 issued Mar. 2, 1982 to Haering entitled, "METHOD FOR PRODUCING HIGH RESOLUTION RECORDING MEDIUM" discloses a method for producing a high resolution, multi-color recording medium comprising the steps of applying a photosensitive masking layer to a substrate, exposing the masking layer, and then developing the masking layer to expose a patterned portion of the underlying substrate. A reflecting layer is then applied over the remaining masking layer and exposed substrate, and then the remaining masking layer is removed, leaving only that portion of the reflecting layer directly over the substrate. A uniformly thick interference layer is then applied over the substrate and the remaining portion of the reflecting layer, and a second reflecting layer is then applied using the same procedures described above in connection with the first reflecting layer.

U.S. Pat. No. 4,842,617 issued Jun. 27, 1989 to Wojnarowski et al. entitled, "EXCIMER LASER PATTERNING OF A NOVEL RESIST USING MASKED AND MASKLESS PROCESS STEPS" describes a dual layer resist configuration for photo-patterning high resolution conductive patterns on underlying polymeric or ceramic substrates, particularly substrates exhibiting surface roughness and non-planar design features such as channels, bosses and ridges. More particularly, a thin underlayer of ablatable photoabsorptive polymer is disposed on a metal coated substrate, after which a thicker layer of substantially transparent material is disposed over the polymer. A beam of laser energy, such as that produced by an ultraviolet excimer laser, is directed through the upper layer and is absorbed by the lower layer which is ablated and simultaneously removes the thick layer above it. This results in the ability to etch high resolution features on polymeric and other substrates, particularly copper coated polyetherimide circuit boards. An alternate method is disclosed which employs two laser exposure steps with the first step being a masked operation on only an ablatable layer and with the second step being an unmasked operation on a dual layer material.

U.S. Pat. No. 4,877,480 issued Oct. 31, 1989 to Das entitled, "LITHOGRAPHIC TECHNIQUE USING LASER FOR FABRICATION OF ELECTRONIC COMPONENTS AND THE LIKE" discloses a microlithographic process of fabricating electronic components, such as, for example, integrated circuit chips and thin film read/write heads for computer disk systems, in which a laser is used to each features defined by a mask. The laser is selected whose radiation will be absorbed by the workpiece being etched, and the masking material is selected so as to be highly reflective of the laser radiation. The masking material is patterned in a conventional manner so as to expose the portions of the workpiece material to be etched. When the laser is directed to the workpiece, the laser radiation etches the portions of the workpiece not protected by the mask. The depth of the recess formed by the laser can be limited by depositing an etch stop layer of reflective material. The depth of the recess formed by the laser can be limited by depositing an etch stop layer of reflective material on a substrate, followed by an intermediate layer of workpiece material to be etched, and then the reflective mask. The laser radiation etches the intermediate layer through the mask to the etch stop layer, which prevents radiation from etching the workpiece further.

SUMMARY OF THE INVENTION

An object of the present invention is to provide a dielectric mask for use with radiation sources for ablating or other patterning of polymers, ceramics and metals and the like.

Another object of the present invention is to provide a mask for use with laser and other sources of radiation which has a relatively long lifetime.

A further object of the present invention is to provide a mask for use with laser and other sources of radiation wherein the mask lifetime is extended by incorporating a patterned reflective layer on the back of the mask to reflect most of the laser energy before it strikes the mask substrate.

A further object of the present invention is to provide a mask for use with laser and other sources of radiation wherein the mask lifetime is extended by incorporating a patterned absorbing layer on the back of the mask to absorb radiation energy before it strikes the mask substrate.

Still another object of the present invention is to provide a fabrication method for an improved dielectric mask.

Another object of the present invention is to provide a means of reducing sensitivity to pinholes in the patterned layer on the front side of the mask.

A still further object of the present invention is to permit the use of alignment marks of materials subject to degradation by the laser.

BRIEF DESCRIPTION OF THE DRAWINGS

FIG. 1 is a schematic illustration of a typical reflective mask for blocking a radiation beam according to the prior art.

FIG. 2 is a schematic illustration of a reflective mask structure for blocking a radiation beam according to the principles of the present invention.

FIGS. 3, 4, 5 and 6 are schematic illustrations showing the various steps in the fabrication method of the mask structure of FIG. 2.

DESCRIPTION OF AN EMBODIMENT OF THE INVENTION

Patterned dielectric reflective masks are presently used for high power excimer laser ablation of polymers and ceramics. These masks, typically consisting of multilayer dielectric coatings deposited on transparent (fused silica) substrates, have very high single-shot damage thresholds. However damage occurs after prolonged exposure to laser irradiation at fluence levels far below the damage threshold. Prolonged exposure to radiation produces damage in both the coatings and the fused silica substrates. These fluence levels, which cause such damage, are necessary and required for ablation of such materials as ceramics and metals and the like.

The high damage threshold in presently known laser ablation masks is achieved by reflecting most of the laser energy rather than absorbing the energy. In a typical application shown in FIG. 1, the laser radiation 10 is incident through the fused silica substrate 12 onto a patterned reflective coating 14. This geometry is required for proper optical imaging of the mask onto the product. The reflective coating 14 is disposed on the "front" side of substrate 12 opposite to the source of radiation. The substrate 12 is therefore exposed to the full power of the laser. In the deep-UV (e.g. 248 nm), even the best quality fused silica exhibits a slight absorption. At high laser fluence levels and high repetition rates, the small absorption leads to substrate heating, greater absorption and eventual damage.

The "open" (i.e. transparent) area of a typical mask is typically less than 10% of the total area. Thus more than 90% of the incident laser energy serves no useful purpose and only contributes to heating and/or damaging of the substrate. The mask of the present invention incorporates a second blocking coating 16 on the back surface of the mask as shown in FIG. 2. The "back" surface of the mask is the side facing the source of radiation. Coating 16 may consist of high-reflectivity material for reflecting the incident radiation, or a highly-absorbant material to absorb the radiation in the place of the mask substrate. For the absorbant embodiment, a metal such as chrome may be used. In the embodiment for a reflecting material, a dielectric layer can be used. This high-reflective dielectric or absorbing coating 16 which can be referred to as premask will eliminate most of the laser energy that leads only to substrate heating or damage without effecting the laser energy transmitted through the open area of the mask. The open areas of the premask 16 will be sufficiently larger than those in the mask so not to interfere with the illumination geometry (i.e. forms "an area is sufficiently large that none of the illumination which would otherwise be incident on the open regions is blocked".) Using a premask 16, substrate heating in a typical laser ablation mask can be reduced by a factor of 10. The invention will be more particularly described with respect to the reflective coating embodiment. It should be noted that the reflective material 16 on the back of the substrate need not be the same type of material used for mask pattern 14. Also the backside reflective layer can be used with any type of front surface patterning, including phase masks.

A method of fabricating the premask 16 of FIG. 2 is set forth referring to FIGS. 3, 4, 5 and 6 as follows:

Step 1

Spin coat about a thin layer 18 of photosensitive polyimide (PSPI) onto the back surface of a dielectric mask substrate 12 having a patterned reflective coating 14 on the front thereof as shown in FIG. 3. As previously stated the "back" surface of the mask substrate is the surface that will face the source of radiation. The patterned coating 14 on the "front" of the mask is the patterned to be projected.

Step 2

Expose the desired pattern into the PSPI layer 18 by flood exposure through the patterned coating 14 on the front side of the mask. The dielectric mask coating 14 is thus used as a proximity mask for the PSPI layer 18.

Step 3

Develop and strip the PSPI to leave polymer remaining in the open areas of the mask since PSPI is a negative resist, as shown in FIG. 4.

Step 4

Deposit, by evaporation or sputtering, a multilayer dielectric coating 16 onto the substrate 12 over the PSPI stencil mask 18 as shown in FIG. 5. Polyimide is required for this step to accommodate the high temperate used for dielectric deposition (about 300 C.) The pattern 18 may be oversized relative to pattern 14 to reduce tolerances of fabrication.

Step 5

Extract the PSPI stencil 18 and dielectric overcoating 16 by laser ablation through the substrate. This can be done either by sufficiently high numerical aperture exposure through the "mask" side or preferably at an alternative (excimer) laser wavelength where the dielectric is high transmissive. Step 5 provides the final result of a patterned remaining dielectric premask 16 on the back surface of the substrate 12 of the mask with features slightly larger and in perfect alignment as shown in FIG. 6.

Alternatively, conventional lithographic techniques can also be used for patterning the polymer 18. This involves photoresist coating/exposure/development followed by reactive ion etching to create the polyimide pattern that can be overcoated with the dielectric reflector. The disadvantage of this scheme is the requirement of alignment of the premask pattern to the mask pattern. However, this is not a critical alignment since the quality of this premask need not be as high as the mask side.

The description hereinabove related to the application of protecting the mask substrate damage due to the laser light passing through it that would ultimately be reflected by the coating on the front of the mask. Other applications are also possible, such as the redirection of unwanted power. Also, in addition to eliminating damage, the present invention provides the elimination of deformation by thermal expansion resulting from absorbtion.

In present high-power tools, the light reflected from the mask goes back into the illumination system where it can quickly damage the optics if there are foci in the glass, or more slowly by gradual browning. In addition, a portion of the reflected light can re-enter the laser cavity, causing unpredictable effects that will affect the consistency of a process. These problems can be reduced or eliminated by patterning the back of the mask with a diffuser or a grating following the principles of the present invention. A diffuser would scatter light in all directions, so that the power everywhere is below the damage threshold. A grating would redirect it into particular directions, where beam dumps would be placed.

The use of the mask of the present invention is not limited to any particular radiation wavelengths.

Another application would be for the negation of front-side pinholes. Pinholes in the front side coating of masks are a problem. They result in unwanted regions of exposure or ablation. An additional pattern on the backside can greatly, perhaps completely, remove this problem. This will increase the yield and decrease production time of masks.

A further application of the present invention is to use in beam blocking and alignment marks. On ablation masks, it is often desirable to use marks in chrome and other materials for alignment. However, the chrome is degraded by the high power laser beam. To eliminate the problem, a mechanical beam block above the mask is currently used. However, this adds complexity to the tool, and in some cases the proximity of the alignment mark to the dielectric pattern makes this blocking almost impossible. By using a dichroic dielectric reflector on the back side, visible light can be used for alignment, while the chrome mask is protected from high power laser light.

Still another use for the present invention is for relative irradiance control. A coating on the backside can be used as to vary the transmission of the mask over large regions. This backside coating can be used to control the etch depth or dose for different features of the mask. When a backside coating is used, coatings of different transmittance could be used. Also, halftone-like structures may also be employed to vary the transmission for irradiance control.

Having thus described our invention, what we claim as new, and desire to secure by Letters Patent is:

1. A mask for blocking a radiation beam directed thereon comprising:
 a radiation transmissive two-sided substrate having a back side disposed to be located facing toward a radiation beam source,
 a first patterned layer of radiation reflective material disposed on the front side of said substrate opposite said back side, said patterned layer of radiation reflective material having radiation transparent areas therein to permit radiation passing through said substrate to also pass through said patterned layer, and wherein said remainder of said patterned layer is composed of a pattern of said reflective material to reflect radiation passing through said substrate back through said substrate;
 and a second patterned layer of radiation blocking material disposed on said back side of said substrate, said second patterned layer having radiation transparent areas therein at the same corresponding positions as said radiation transparent areas in said first layer of radiation reflective material on said front side of said substrate wherein said radiation transparent areas in said second patterned layer are larger than the said corresponding radiation transparent areas in said first patterned layer on said front side of said substrate, said second patterned layer functioning to reflect radiation prior to impinging on said back side of said substrate.

2. A mask according to claim 1 wherein said second patterned layer is composed of high-reflectivity dielectric material for reflecting said radiation prior to impinging on the back side of said substrate.

3. A mask according to claim 2 wherein the said radiation transparent areas in said second patterned layer on said back side of said substrate are larger than said corresponding radiation transparent areas in said patterned layer on said front side of said substrate.

4. A method of fabricating a reflective mask comprising the steps of:
 step 1 forming a patterned layer of reflective material having illumination transmission areas on a front side of a two-sided substrate composed of dielectric material;
 step 2 disposing a layer of photosensitive material onto the back side of said substrate;
 step 3 expose said layer of photosensitive material by illumination directed through said patterned front side of said substrate;
 step 4 develop and strip said exposed photosensitive layer to leave patterned photosensitive material in the areas corresponding to but larger than said illumination transmissive areas of said layer of reflective material on said front side of said substrate;
 step 5 dispose a layer of dielectric material over said back side of said substrate and over said pattern of photosensitive material on said back side of said substrate;
 step 6 remove said patterned layer of photosensitive material and said dielectric material disposed thereon from said back side of said substrate.

5. A method according to claim 4 wherein said photosensitive material in step 4 is a negative photoresist.

6. A method according to claim 4 wherein said dielectric material disposed over said substrate in step 5 is a multilayer dielectric coating evaporated onto said substrate surface.

7. A method according to claim 4 wherein said patterned layer of photosensitive material is removed in step 6 by ablation with a laser beam.

8. A mask for blocking a radiation beam directed thereon comprising:
 a radiation transmissive two-sided substrate having a back side disposed to be located facing toward a radiation beam source,
 a first patterned layer of radiation absorbing material disposed on the front side of said substrate opposite said back side, said patterned layer of radiation reflective material having radiation transparent areas therein to permit radiation passing through said substrate to also pass through said patterned layer, and wherein said remainder of said patterned layer is composed of a pattern of said absorbing material to absorb radiation passing through said substrate;
 and a second patterned layer of radiation blocking material disposed on said back side of said substrate, said second patterned layer having radiation transparent areas therein at the same corresponding positions as said radiation transparent areas in said first layer of radiation absorbing material on said front side of said substrate wherein said radiation transparent areas in said second patterned layer are larger than the said corresponding radiation transparent areas in said first patterned layer on said front side of said substrate, said second patterned layer functioning to reflect radiation prior to impinging on said back side of said substrate.

9. A mask according to claim 8 wherein said second patterned layer is composed of high-reflectivity dielectric material for reflecting said radiation prior to impinging on the back side of said substrate.

10. A mask according to claim 9 wherein the said radiation transparent areas in said second patterned layer on said back side of said substrate are larger than said corresponding radiation transparent areas in said patterned layer on said front side of said substrate.

11. A mask for blocking a radiation beam directed thereon comprising:
 a radiation transmissive two-sided substrate having a back side disposed to be located facing toward a radiation beam source,
 a first patterned layer of radiation absorbing material disposed on the front side of said substrate opposite said back side, said patterned layer of radiation reflective material having radiation transparent areas therein to permit radiation passing through said substrate to also pass through said patterned layer, and wherein said remainder of said patterned layer is composed of a pattern of said absorbing material to reflect radiation passing through said substrate back through said substrate;
 and a second patterned layer of radiation blocking material disposed on said back side of said substrate, said second patterned layer having radiation transparent areas therein at the same corresponding positions as said radiation transparent areas in said first layer of radiation reflective material on said front side of said substrate wherein said radiation transparent areas in said second patterned layer are larger than the said corresponding radiation transparent areas in said first patterned layer on said front side of said substrate, said second patterned layer functioning to reflect radiation prior to impinging on said back side of said substrate.

12. A mask according to claim 11 further including a laser radiation beam produced by a laser source having a given numerical aperture.

13. A mask according to claim 12 wherein the said radiation transparent areas in said second patterned layer on said back side of said substrate are larger than said corresponding radiation transparent areas in said patterned layer on said front side of said substrate by an amount sufficient such that the illumination passing therethrough forms an angle with the axis of said radiative beam which is greater than the numerical aperture of said laser.

14. A mask for blocking a radiation beam directed thereon comprising:
 a radiation transmissive two-sided substrate having a back side disposed to be located facing toward a radiation beam source,
 a first patterned layer of radiation absorbing material disposed on the front side of said substrate opposite said back side, said patterned layer of radiation reflective material having radiation transparent areas therein to permit radiation passing through said substrate to also pass through said patterned layer, and wherein said remainder of said patterned layer is composed of a pattern of said absorbing material to absorb radiation passing through said substrate;
 and a second patterned layer of radiation blocking material disposed on said back side of said substrate, said second patterned layer having radiation transparent areas therein at the same corresponding positions as said radiation transparent areas in said first layer of radiation absorbing material on said front side of said substrate wherein said radiation transparent areas in said second patterned layer are larger than the said corresponding radiation transparent areas in said first patterned layer on said front side of said substrate, said second patterned layer functioning to reflect radiation prior to impinging on said back side of said substrate.

15. A mask according to claim 14 further including a laser radiation beam produced by a laser source having a given numerical aperture.

16. A mask according to claim 15 wherein the said radiation transparent areas in said second patterned layer on said back side of said substrate are larger than said corresponding radiation transparent areas in said patterned layer on said front side of said substrate by an amount sufficient such that the illumination passing therethrough forms an angle with the axis of said radiative beam which is greater than the numerical aperture of said laser.

* * * * *